United States Patent
Bamba et al.

(10) Patent No.: US 9,578,751 B2
(45) Date of Patent: Feb. 21, 2017

(54) METHOD FOR PRODUCING A RESIN SUBSTRATE HAVING A METAL FILM PATTERN FORMED THEREON

(75) Inventors: Akimitsu Bamba, Fukui (JP); Kazuhisa Tsujimoto, Fukui (JP); Hideyuki Yamada, Fukui (JP); Kouichi Kugimiya, Fukui (JP)

(73) Assignee: SEIREN CO., LTD., Fukui (JP)

( * ) Notice: Subject to any disclaimer, the term of this patent is extended or adjusted under 35 U.S.C. 154(b) by 166 days.

(21) Appl. No.: 14/122,797

(22) PCT Filed: May 17, 2012

(86) PCT No.: PCT/JP2012/062719
§ 371 (c)(1),
(2), (4) Date: Feb. 6, 2014

(87) PCT Pub. No.: WO2012/165168
PCT Pub. Date: Dec. 6, 2012

(65) Prior Publication Data
US 2014/0178571 A1 Jun. 26, 2014

(30) Foreign Application Priority Data
May 30, 2011 (JP) ................................. 2011-121130

(51) Int. Cl.
*B05D 5/12* (2006.01)
*C23C 18/30* (2006.01)
(Continued)

(52) U.S. Cl.
CPC ............... *H05K 3/182* (2013.01); *B41M 1/30* (2013.01); *C23C 18/1608* (2013.01);
(Continued)

(58) Field of Classification Search
USPC ... 427/97.3, 98.4, 98.5, 99.1, 304, 305, 437, 427/438, 443.1
See application file for complete search history.

(56) References Cited

U.S. PATENT DOCUMENTS 4,666,735 A * 5/1987 Hoover ................. H01L 21/702
257/E21.533
5,133,840 A * 7/1992 Buchwalter ................. C08J 7/12
205/167

(Continued)

FOREIGN PATENT DOCUMENTS

CN 101557927 A 10/2009
JP 2001-172769 6/2001
(Continued)

OTHER PUBLICATIONS

Chinese Office Action dated Feb. 1, 2016 in corresponding Chinese Application No. 201280026276.6.
(Continued)

*Primary Examiner* — Brian K Talbot
(74) *Attorney, Agent, or Firm* — Wenderoth, Lind & Ponack, L.L.P.

(57) ABSTRACT

The purpose of the present invention is to provide a method for using a metal ion solution of low concentration to efficiently form a metal film pattern of excellent accuracy and reliable adhesion on a resin substrate. A resin substrate having a metal film pattern formed thereon is produced by a method that includes the following steps (a) to (e): (a) a step for pattern-printing of a latent image agent (2) onto the surface of a resin substrate (1) ; (b) a step for bringing the area imprinted with the latent image agent (2) into contact with a solution containing metal ions, and forming a metal salt (3); (c) a step for bringing the metal salt (3) into contact with an acidic treatment liquid containing a reducing agent, and reducing the metal salt; (d) a step for forming an
(Continued)

electroless nickel plating film (5) on the area imprinted with the latent image agent; and (e) a step for precipitating an electroless copper plating (6) onto the surface of the nickel plating film (5).

7 Claims, 2 Drawing Sheets

(51) Int. Cl.
*H05K 3/18* (2006.01)
*B41M 1/30* (2006.01)
*C23C 18/16* (2006.01)
*C23C 18/20* (2006.01)
*B05D 7/00* (2006.01)
*B05D 1/28* (2006.01)
*C23C 18/36* (2006.01)
*C23C 18/40* (2006.01)

(52) U.S. Cl.
CPC ...... *C23C 18/1651* (2013.01); *C23C 18/2086* (2013.01); *C23C 18/30* (2013.01); *B05D 1/28* (2013.01); *B05D 5/12* (2013.01); *B05D 7/52* (2013.01); *C23C 18/36* (2013.01); *C23C 18/405* (2013.01); *H05K 2201/0154* (2013.01); *H05K 2203/0793* (2013.01)

(56) References Cited

U.S. PATENT DOCUMENTS

| | | | |
|---|---|---|---|
| 5,395,652 A | * | 3/1995 | Bernards ................ C23C 18/30 106/1.11 |
| 5,468,597 A | * | 11/1995 | Calabrese ................ G03F 7/40 427/304 |
| 6,174,647 B1 | * | 1/2001 | Cahalen ................ G03F 7/40 257/E21.174 |
| 8,673,428 B2 | | 3/2014 | Naoyuki et al. |
| 2003/0143411 A1 | * | 7/2003 | Nakagawa ................ C08F 8/04 428/458 |
| 2005/0153059 A1 | * | 7/2005 | Wakizaka ............ C23C 18/2006 427/96.1 |
| 2006/0165877 A1 | * | 7/2006 | Yanagimoto ............ C23C 18/04 427/58 |
| 2007/0212496 A1 | * | 9/2007 | Tomita ................ C08J 7/12 427/483 |
| 2010/0296166 A1 | * | 11/2010 | Hayashi ............ C23C 18/1608 359/585 |

FOREIGN PATENT DOCUMENTS

| | | | |
|---|---|---|---|
| JP | 2003-347724 | | 12/2003 |
| JP | 2005-45236 | | 2/2005 |
| JP | 2005-154895 | * | 6/2005 |
| JP | 3825790 | | 7/2006 |
| JP | 02007103479 | * | 4/2007 |
| JP | 2008-053682 | * | 3/2008 |
| JP | 2008-53682 | | 3/2008 |
| JP | 2008-254331 | | 10/2008 |
| JP | 2009-076740 | * | 4/2009 |
| JP | 2009-290003 | | 12/2009 |
| JP | 2010-157589 | | 7/2010 |
| JP | 2010-157589 | * | 9/2010 |
| JP | 2010-221481 | | 10/2010 |
| JP | 2011-14801 | | 1/2011 |
| WO | 2008/081904 | | 7/2008 |
| WO | 2009/080642 | | 7/2009 |

OTHER PUBLICATIONS

International Search Report issued Aug. 14, 2012 in International (PCT) Application No. PCT/JP2012/062719.
Chinese Office Action dated Sep. 26, 2016 in corresponding Chinese Patent Application No. 201280026276.6, with English translation.

* cited by examiner

METHOD FOR PRODUCING A RESIN SUBSTRATE HAVING A METAL FILM PATTERN FORMED THEREON

TECHNICAL FIELD

The present invention relates to a method for producing a resin substrate having a metal film pattern formed thereon

BACKGROUND ART

A resin material having a metal film pattern formed thereon has long been used in the field of electronics parts, decorative products and the like. For example, a film having a metal film formed as a circuit pattern on the surface of a resin substrate has widely been used as a flexible printed circuit board or the like. Conventionally, formation of a metal film pattern on the surface of a resin substrate has been carried out commonly by a process of firstly laminating the resin film substrate with a copper foil through an adhesive to produce a copper-clad laminate, drawing a desired pattern thereon, and dissolving copper foil of the part other than the pattern to remove by an etching process.

In association with the recent development of the electronics industry, however, demands for making a metal film pattern finer and for making adhesion of a metal film higher have been increased.

On the other hand, the above-mentioned conventional method has problems such that heat resistance of the adhesive bonding a resin film substrate and copper foil is low, and as a result, adhesiveness of the metal film becomes low.

According to the above-mentioned etching process, in addition, it may be difficult to etch a metal film pattern with high accuracy since it is difficult to control the rate of dissolving of the metal film.

Furthermore, it is known that the bonded interfacial surface of the metal film and resin is corroded by an etching liquid, and it might cause deterioration of adhesiveness particularly in the case of a fine pattern.

Accordingly, in a manufacturing process comprising an etching process, there has been a problem such that it is difficult to handle a fine pattern with high adhesiveness such as a fine pattern having a width of several dozen micrometers (μm).

In order to overcome the above problems, a method of forming a metal film on the surface of a resin film without using adhesives has been developed, and an evaporation method and a sputtering method thereof are used.

However, in the case of using an evaporation method, reliable adhesion is insufficient in some cases. In the case of using a sputtering method, adhesion strength is expected to be high but an etching process is required for forming a metal film pattern and there remains a problem such that it is difficult to deal with making a pattern finer.

A direct writing technology and a direct metalization technology have been attracting attention in these days.

Examples of the direct writing technology include a method of printing a pattern using nanosilver paste and baking it to form a conductive pattern and a method of drawing a pattern directly using an ink containing plating catalyst such as palladium and forming an electroless plating film on said ink.

These methods have advantages such that an etching process can be omitted by drawing a pattern directly. However, there is a problem in adhesion strength between paste or ink and a resin. In addition, paste and ink to be used are highly expensive. Furthermore, the conductive pattern obtained by these methods has high electric resistance, and therefore, electrical property as a metal film is insufficient.

The direct metalization technology is expected in its highly reliable adhesion between a metal film and a resin. According to the Patent Documents 1, 2 and 3, a polyimide resin film is treated with alkali to open its imide ring to form carboxyl groups, a metal salt is adsorbed to said carboxyl group and said metal salt is reduced to form a metal film. This method is expected in highly reliable adhesion because a metal film is formed through functional groups formed on a polyimide resin film without using adhesives. According to these methods, however, a metal film is formed on the whole surface of a substrate in advance, and subsequently an etching process must be carried out in order to make the metal film patterned, which is same as the conventional methods.

In the etching process, the metal film on the interfacial surface of the resin might be corroded and there still remains a problem that it is difficult to deal with a thin line pattern having highly reliable adhesion.

The Patent Document 4 discloses a method of cleaving an imide ring by applying an alkali solution on an inorganic thin film formation portion of a polyimide resin substrate by an ink-jet process, adsorbing a metal ion to said portion to produce a metal salt and reducing said metal salt to form an inorganic thin film pattern. According to this method, it is demonstrated that an inorganic thin film pattern can be formed on a polyimide resin substrate without using an etching process. However, since a low-viscosity solution is discharged according to the ink-jet process in general, there are problems such as bleeding and/or repelling of the alkali solution on the polyimide resin, which might cause difficulty in forming a fine pattern.

In addition, the above-mentioned patent document does not disclose a finding concerning suppression of the falling of metal ions in the metal ion reduction process. Therefore, there is a problem that it is necessary to use a highly-concentrated metal ion solution. Furthermore, it might be unable to adsorb sufficient metal ions for forming an inorganic thin film.

PRIOR ART DOCUMENTS

Patent Document

Patent Document 1: Jpn. Pat. No. 3825790
Patent Document 2: Jpn. Pat. Laid-Open Publication No. 2008-053682
Patent Document 3: Jpn. Pat. Laid-Open Publication No. 2011-014801
Patent Document 4: Jpn. Pat. Laid-Open Publication No. 2005-045236

DISCLOSURE OF THE INVENTION

Problems to be Solved by the Invention

The problem to be solved by the present invention is to provide a method for efficiently forming a metal film pattern excellent in adhesion and accuracy on a resin substrate using a metal ion solution of low concentration.

Means for Solving the Problems

The inventors of the present invention paid intensive research efforts to dissolve the above problem, and as a result, they found that an acidic treatment liquid containing a reducing agent can suppress the falling of metal in the process of forming a metal film pattern on a resin substrate, and thus completed the present invention.

That is, the present invention provides a method for producing a resin substrate shown as follows:

1) A method for producing a resin substrate having a metal film pattern formed thereon which comprises the following steps (a) to (e):
   (a) a step for pattern-printing of a latent image agent onto the surface of a resin substrate,
   (b) a step for bringing the area imprinted with the latent image agent into contact with a solution containing metal ions to form a metal salt,
   (c) a step for bringing the metal salt into contact with an acidic treatment liquid containing a reducing agent to reduce the metal salt,
   (d) a step for forming an electroless nickel plating film on the area imprinted with the latent image agent, and
   (e) a step for depositing an electroless copper plating onto the surface of the nickel plating film.
2) The method for producing a resin substrate according to 1), wherein said latent image agent is an alkali solution containing at least one of metal hydroxides selected from the group consisting of potassium hydroxide and sodium hydroxide.
3) The method for producing a resin substrate according to 1) or 2), wherein the metal ion concentration of said solution containing metal ions is from 0.01 mM to 0.9 mM.
4) The method for producing a resin substrate according to any one of 1) to 3), wherein said metal ion is palladium ion.
5) The method for producing a resin substrate according to any one of 1) to 4), wherein pH of said acidic treatment liquid is 6 or lower.
6) The method for producing a resin substrate according to any one of 1) to 5), wherein the viscosity of said latent image agent, measured by a cone-plate viscometer at 25° C. with a rotor rotation number of 0.5 rpm, is in the range from 50 to 500 Pa·s.
7) The method for producing a resin substrate according to any one of 1) to 6), wherein pattern-printing of a latent image agent is carried out by using a gravure printing technology.
8) The method for producing a resin substrate according to 7), wherein the engraved groove of the gravure printing plate used for said gravure printing technology has a depth of 1 to 10 μm and a line width of 10 to 50 μm.

Effect of the Invention

According to the method of the present invention, a resin substrate having a metal film pattern excellent in reliable adhesion can be produced. According to the method of the present invention, adhesives are not used on the interfacial surface between the metal film and the resin. An etching process for forming a pattern is not used either. Therefore, the present invention enables to solve the problems of deterioration of reliable adhesion of a metal film caused by adhesives and/or corrosion by an etching solution which had been problems of conventional art.

According to the present invention, in addition, the use of an acidic treatment liquid containing a reducing agent in the process of reducing a metal salt would bring about less occurrence of falling of metal ions in the post process. Therefore, the processes can be carried out with a lower metal ion concentration as compared with a conventional technology, which is excellent in terms of practical utility.

Furthermore, by regulating viscosity of a latent image agent and/or by employing a gravure printing technology, it would be possible to form a fine pattern having excellent accuracy.

EXPLANATION OF REFERENCE LETTERS

1: Resin Substrate
2: Latent Image Agent
3: Metal Salt
4: Metal
5: Electroless Nickel Plating Film
6: Electroless Copper Plating Film
(A): Width of Engraved Groove (Width of a side of a recessed part of a dot)
(B): Depth of Engraved Groove (Depth of a recessed part of a dot)
(C): Distance between centers of recessed parts of dots

MODES FOR CARRYING OUT THE INVENTION

The method of the present invention comprises a step (a) which is a pattern-printing process, a step (b) which is a metal salt-producing process, a step (c) which is a reducing process, a step (d) which is a nickel plating film-forming process and a step (e) which is a copper plating film-forming process. A schematic diagram of a preferable embodiment of the process of the present invention is shown in FIG. 1.

Figure 1:
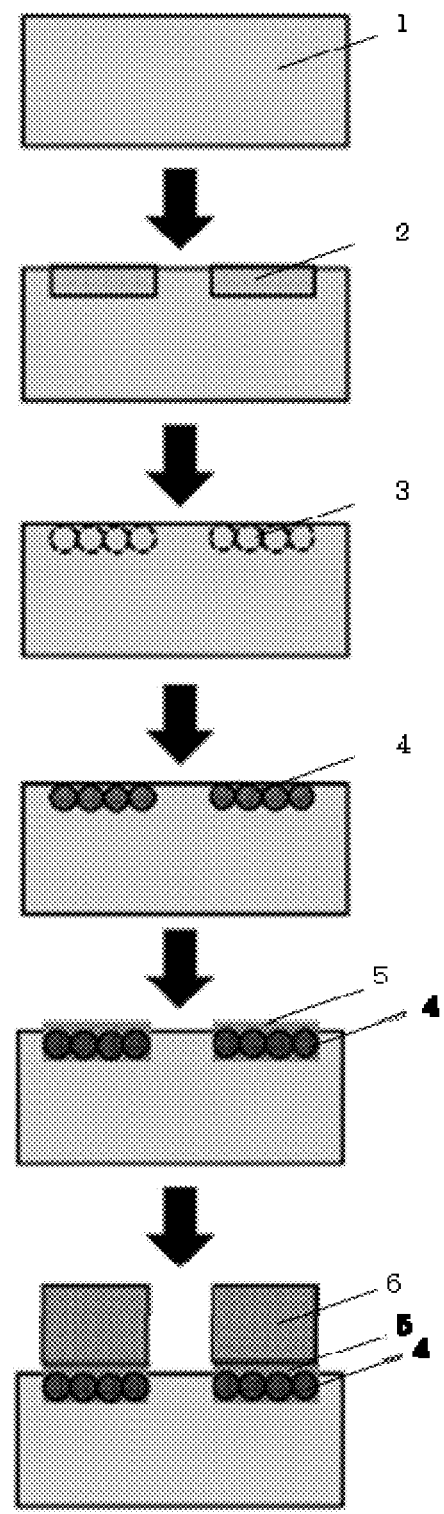
FIG. 1 shows a schematic diagram for one embodiment of the method of the present invention which is a preferable process.

(1) Step (a):

In the step (a) of the present invention, pattern-printing of a latent image agent (reference number 2 in FIG. 1) is carried out on a resin substrate (reference number 1 in FIG. 1).

As for the resin substrate of the present invention, any resins can be employed as long as its surface can be modified by a latent image agent of the present invention. Examples of the resins include polyethylene terephthalate (PET), polyethylene naphthalate (PEN) and polyimide (PI). Among them, it is preferable to use a polyimide resin which is readily hydrolyzable and is advantageous for latent image printing.

Polyimide is a polymer having a cyclic imide structure in its main chain and is excellent in heat resistance, mechanical strength, chemical resistance, electrical insulating properties and the like. For example, brand name "Kapton", manufactured by Du Pont, and brand name "UPILEX", manufactured by Ube Industries, Ltd., are known as industrial products of polyimide.

The shape of the substrate is not particularly limited and a resin film and a resin plate can be used. As a flexible resin substrate, a film-formed substrate having a film thickness of 12 micrometer (μm) to 50 μm can be suitably used.

In the step (a), a latent image agent is applied on the surface of the resin substrate using a pattern-printing method. Thereby, an imide ring of the resin contacted by the latent image agent is cleaved to form a modified layer containing a carboxylic group thus produced. That is, a modified layer is formed on the resin substrate in the form of a pattern by this step (a).

The above-mentioned latent image agent is an alkaline solution containing alkali compounds such as potassium hydroxide, sodium hydroxide, calcium hydroxide, magnesium hydroxide and ethylenediamine. Preferably, the latent image agent is an alkaline solution containing at least one metal hydroxide selected from the group consisting of potassium hydroxide, sodium hydroxide, calcium hydroxide and magnesium hydroxide.

From the viewpoint of cost of chemical agents, it is more preferable that the latent image agent is an alkaline solution containing at least one metal hydroxide selected from the group consisting of potassium hydroxide and sodium hydroxide.

The alkali concentration or the concentration of alkali compounds of the above-mentioned latent image agent is not particularly limited. The preferable alkali concentration is 0.01M to 10M, more preferably 0.5M to 5M. In the case that the alkali concentration is too lower beyond the above range, the modification reaction of the surface of the resin substrate might become insufficient which might cause difficulty in forming a metal film. In the case that the alkali concentration is too high, the resin might be modified too much which might cause difficulty in forming a fine pattern.

Besides the metal hydroxides, auxiliary agents such as fillers, thixotropic agents, binder resins, organic solvents and thickening agents can be added arbitrarily into the above-mentioned latent image agent to control printing performance. For example, viscosity of the latent image agent can be conditioned by these auxiliary agents to improve printing performance.

While viscosity of the latent image agent is not particularly limited in the present invention, it is desirable to use a latent image agent wherein, for example, the viscosity measured by a cone-plate viscometer at 25° C. with a rotor rotation number of 0.5 rpm is preferably in the range from 50 to 500 Pa·s, more preferably in the range from 100 to 400 Pa·s.

When the viscosity of the latent image agent is in the above range, the line width of printed patterns can be made thinner which enables to print a fine pattern.

The method for carrying out pattern-printing of a latent image agent in the present invention can be selected from conventional technologies publicly known such as a screen printing technology, a gravure printing technology, a flexographic printing technology and an inkjet printing technology according to the pattern. In order to print fine patterns with high productivity, it is preferable to use an intaglio printing technology or a gravure printing technology.

Figure 2:
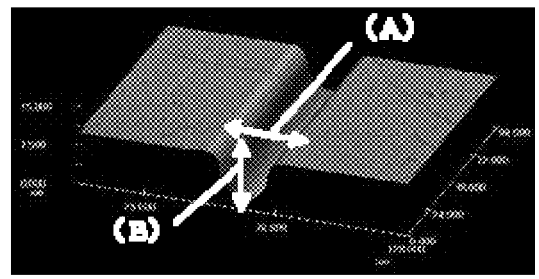
FIG. 2 shows a schematic diagram showing a linear-shape engraved groove of a gravure printing plate which is preferably used for the method of the present invention.
Figure 3:
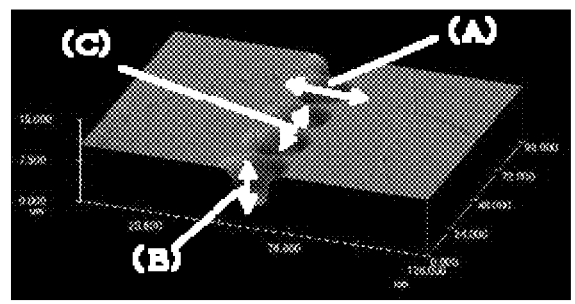
FIG. 3 shows a schematic diagram showing a dot-shape engraved groove (a recessed part) of a gravure printing plate which is preferably used for the method of the present invention.

As for the shapes of engraved grooves of a gravure printing plate used for the above-mentioned gravure printing, a linear shape shown in FIG. 2, a dot shape shown in FIG. 3 or the like can be selected. In FIG. 2, (A) represents a width of an engraved groove and (B) represents a depth of an engraved groove. In FIG. 3, (A) represents a width of a side of a recessed part of a dot-shaped engraved groove, (B) represents a depth of a recessed part of a dot-shaped engraved groove and (C) represents a distance between the centers of recessed parts of dot-shaped engraved grooves.

When the shape of an engraved groove is linear, the depth of the engraved groove, "B" in FIG. 2, is 1 μm to 10 μm, preferably 3 μm to 8 μm. In case that the depth of linear-shaped engraved grooves is too small or too shallow, it might be unable to sufficiently hold the latent image agent, which might cause missing or disconnection of the printed pattern of the latent image agent on the resin. When the depth is too large or too deep, the amount of latent image agent might become excess and the line width might become too thick, which might cause difficulty in printing fine patterns.

The line width of the linear-shaped engraved groove, "A" in FIG. 2, is 10 μm to 50 μm, preferably 15 μm to 25 μm. When the line width is too narrow, it might be unable to sufficiently hold the latent image agent, which might cause missing or disconnection of the printed pattern of the latent image agent on the resin. When the line width is too wide, the line width of the printed pattern might become too thick, which might cause difficulty in printing fine patterns.

A line can also be formed by an intaglio plate having recessed parts of continuous dotty engraved grooves or dots (FIG. 3). In this case, the depth of the recessed part of said dot ((B) in FIG. 3) is preferably 1 μm to 10 μm, more preferably 3 μm to 8 μm. The width of a side of the recessed part of said dot ((A) in FIG. 3) is preferably 10 μm to 50 μm, more preferably 15 μm to 25 μm. The distance between the centers of said recessed parts ((C) in FIG. 3) is preferably 15 μm to 25 μm. Within the above ranges, printed lines having a line width of 50 μm or less can be formed with high accuracy.

The line width of the printed pattern thus formed on the resin substrate is not particularly limited. The preferable line width is 10 μm to 100 μm, more preferably 20 μm to 50 μm.

After carrying out pattern-printing, the latent image agent is held for a certain period of time in a coated state on the resin substrate, and then is removed by washing with water. During said holding time, a portion of the surface of the resin substrate to which the latent image agent adheres is modified to form carboxyl groups. The holding time and holding temperature are not particularly limited. Since modification reaction is accelerated when holding time is long and holding temperature is high, the holding temperature is 10° C. to 80° C., more preferably 20° C. to 50° C. The preferable holding time is 10 seconds or longer, more preferably 15 seconds or longer. Whereas the upper limit of the holding time is not particularly limited, it is preferably around 10 minutes. Effects of long holding time on reactivity would not be significant because modification ability of the latent image agent would be degraded as the reaction progresses and would be lost by drying.

(2) Step (b):

In the subsequent step (b), a metal salt (3 in FIG. 1) is produced by bringing the area imprinted with the latent image agent into contact with a solution containing metal ions. That is, a solution containing metal ions is applied on the surface of the resin substrate which is modified by the above-mentioned latent image agent.

Examples of the metal ions include at least one selected from the group consisting of palladium ion, copper ion and nickel ion. The metal ion is coordinated to the carboxyl group produced on the polyimide resin substrate by the above-mentioned step (a) to form a metal salt.

The metal ion concentration in the solution containing metal ions is preferably 0.01 mM to 50 mM, more preferably 0.05 mM to 20 mM, further preferably 0.05 mM to 10 mM, most preferably 0.08 mM to 0.9 mM. As mentioned below, since an acidic treatment liquid containing a reducing agent is used in the process of reducing a metal salt, the method of the present invention is free from falling off of metal ions in the subsequent steps. Therefore, processes can be carried out with a lower metal ion concentration compared to the conventional technologies. Thus, the method of the present invention is characterized by high practicability.

The solvent to be used for the above-mentioned solution containing metal ions is not particularly limited. Preferably, water is used as the solvent.

Examples of methods for contacting the resin substrate with the above-mentioned solution containing metal ions include a method of immersing the resin substrate into the solution containing metal ions and a method of spraying the solution containing metal ions on the resin substrate.

The reaction temperature at the time of contacting the resin substrate with the solution containing metal ions is preferably 10° C. to 80° C., more preferably 30° C. to 50° C. The time of contacting the resin substrate with the solution containing metal ions is preferably 10 seconds to 800 seconds, more preferably 60 seconds to 500 seconds.

After contacting with the solution containing metal ions, the resin substrate is washed with water to remove metal ions adhered nonspecifically. Washing can be carried out efficiently by using ultrasonic cleaning or the like.

(3) Step (c):

In the step (c), the resin substrate is brought into contact with an acidic treatment liquid containing a reducing agent, whereby the metal salt formed on the surface of the resin substrate in the step (b) is reduced (4 in FIG. 1). Examples of the reducing agents used for the acidic treatment liquid containing a reducing agent include dimethylamineborane, sodium hypophosphite, hydrazine, methanol, diethylmethylamine and ascorbic acid. Among them, dimethylamineborane is most preferable in terms of usability in a more acidic region.

The concentration of reducing agent in the acidic treatment liquid containing a reducing agent is preferably 1 mM to 100 mM, more preferably 10 mM to 30 mM. The solvent to be used for the acidic treatment liquid containing a reducing agent of the present invention is not particularly limited. It is preferable to use water as the solvent.

The pH of the acidic treatment liquid containing a reducing agent of the present invention is preferably 6 or less, more preferably 2 to 6, further preferably 3 to 5.9. In the case that pH is too high, falling of the metal salt formed on the resin substrate in the step (b) might occur.

The acidic treatment liquid containing a reducing agent of the present invention can be prepared by dissolving said reducing agent into an acidic buffer agent accordingly in order to maintain an appropriate pH range. Known buffer agents can be used as said acidic buffer agent. Examples thereof include a 0.1M citrate buffer solution and an acetate buffer solution. The acidic treatment liquid containing a reducing agent of the present invention is capable of neutralizing the alkali latent image agent applied on the resin substrate, preventing the resin from re-modification and suppressing the falling of metal salt formed on the resin substrate. Therefore, the method of the present invention enables to use a low-concentrated solution containing metal ions and to reduce metal salt efficiently.

The contact time of the resin substrate with the acidic treatment liquid containing a reducing agent of the present invention is preferably 60 seconds to 600 seconds, more preferably 180 seconds to 300 seconds. The contact temperature is preferably 10° C. to 80° C., more preferably 30° C. to 50° C.

After contacting with the acidic treatment liquid containing a reducing agent, the resin substrate is washed with water to remove the solution containing a reducing agent adhered nonspecifically.

(4) Step (d):

In the step (d) of the present invention, an electroless nickel plating film (5 in FIG. 1) is formed on the area wherein the metal salt is reduced in the above-mentioned step (c). Existing plating baths can be used for said electroless nickel plating. The aforementioned resin substrate can be immersed into said plating bath. The reaction time and temperature of plating can be regulated appropriately depending on the plating film thickness.

The film thickness of the electroless nickel plating film of the present invention is preferably 10 nm to 300 nm, more preferably 20 nm to 200 nm. The electroless nickel plating film functions as a seed layer to improve adhesiveness with the resin substrate, and a thin film having the film thickness in the above-mentioned range can exhibit said effect.

After forming an electroless nickel plating film, the resin substrate is washed with water to remove the plating solution adhered nonspecifically.

(5) Step (e)

In the step (e) of the present invention, an electroless copper plating film (6 in FIG. 1) is deposited onto the surface of the electroless nickel plating film formed in the step (d). Existing plating baths can be used for said electroless copper plating. Examples of the plating baths include a bath using a copper complexing agent such as Rochelle salt, EDTA and Quadrol, a formaldehyde bath using formaldehyde as a reducing agent and a formaldehyde-free bath using glyoxylic acid or the like as a reducing agent. In order to prevent re-modification of the resin substrate, it is more preferable that the pH of the electroless plating bath used in the present invention is in a range of slightly alkaline to neutral.

The reaction time and temperature of the electroless copper plating can be regulated appropriately depending on the plating film thickness.

The film thickness of the electroless copper plating film of the present invention is not particularly limited. In terms of productivity, it is preferably in the range of 0.5 μm to 10 μm, more preferably in the range of 1 μm to 6 μm.

According to the present invention, a resin substrate on which a metal (copper) film pattern having a film thickness of preferably 0.5 μm to 10 μm, more preferably 1 μm to 6 μm and a line width of preferably 20 μm to 100 μm, more preferably 30 μm to 50 μm is formed can be obtained by going through the steps (a) to (e).

The resin substrate thus obtained can suitably be used for a flexible circuit board, a radio-frequency tag and the like.

EXAMPLES

The present invention will be described in more detail below referring to Examples and Comparative Examples, which are not intended to limit the scope of the present invention.

Example 1

A polyimide resin substrate for printing of a latent image agent was prepared by cutting a polyimide film having a width of 30 cm and a thickness of 25 μm, brand name "Kapton H" manufactured by DU PONT-TORAY CO., LTD., to a proper size. Subsequently, pattern-printing of a latent image agent onto the surface of said polyimide resin substrate was carried out by using a gravure printer.

The latent image agent used here was prepared by adding carboxymethyl cellulose and a thixotropic agent for regulating viscosity appropriately to a solution comprising potassium hydroxide (KOH) as an alkaline compound with the alkali concentration of 3M. The viscosity of the latent image agent, measured by a cone-plate viscometer at 25° C. with a rotor rotation number of 0.5 rpm, was 370 Pa·s.

As for pattern-printing, gravure printing was carried out by using a gravure printing plate having a linear engraved groove shown in FIG. 2. The engraved groove of the gravure printing plate has a line width of 21 μm and a depth of 5 μm. By using the gravure printing plate, a printed pattern having a line width of 30 μm was formed on the polyimide resin substrate.

The polyimide resin substrate pattern-printed with the latent image agent was held at 25° C. for 60 seconds, and then was washed with water to remove the latent image agent. Subsequently, the polyimide resin substrate was immersed into a 0.1 mM aqueous solution of palladium chloride at 40° C. for 300 seconds to form a palladium salt of carboxyl group formed by a latent image agent. Thereafter, the polyimide resin substrate was took out from the solution and was washed with water to remove palladium chloride nonspecifically adhered.

Subsequently, the above-mentioned polyimide resin substrate was immersed into an acidic treatment liquid containing a reducing agent, which was a 0.1M citrate buffer solution of pH6 containing 20 mM of dimethylamine borane, at 40° C. for 180 seconds to reduce the palladium salt on the polyimide resin substrate.

Thereafter, the polyimide resin substrate was took out from the acidic treatment liquid containing a reducing agent and was washed with water to remove the reducing agent nonspecifically adhered.

Subsequently, the above-mentioned polyimide resin substrate was immersed into an electroless nickel plating bath having a composition shown in Table 1 at 35° C. for 1 minute to form a nickel plating film having a film thickness of 100 nm.

Thereafter, the polyimide resin substrate was washed with water to remove the nickel plating solution, and then was immersed into an electroless copper plating bath having a composition shown in Table 1 at 50° C. for 60 minutes to form an electroless copper plating film.

By going through the above-mentioned steps, a polyimide resin substrate on which a metal film pattern having a line width of 30 to 40 μm and a metal (copper) film thickness of 4 μm was formed was obtained.

Example 2

In this example, gravure printing was carried out by using a gravure printing plate having a dot-shaped engraved groove shown in FIG. 3 was used for gravure printing. The width of a side of a dot of the engraved groove of said gravure printing plate was 20 μm, the depth was 6 μm and the distance between the centers of recessed parts of the dots was 22 μm. An experiment was carried out by adjusting other conditions same as in Example 1, whereby a printed pattern having a line width of 27 μm was formed on the polyimide resin substrate.

By carrying out the same steps as in Example 1, a polyimide resin substrate on which a metal film pattern having a line width of 30 to 40 μm and a metal film thickness of 4 μm was formed was obtained.

Example 3

In this example, aqueous solutions of palladium chloride having concentrations of 0.85 mM, 0.43 mM, 0.085 mM and 0.0085 mM respectively was used. Experiments were carried out by adjusting other conditions same as in Example 1 until the step of electroless nickel plating. A comparative experiment was also carried out at the same time by using an aqueous solution having a 0 mM palladium chloride concentration.

Evaluation of selective deposition of nickel plating was performed under the following standard:
X; Not Deposited
◯: Deposited The result of evaluation was shown in Table 2. By the above process, selective deposition of plating was found in the modified area imprinted with a latent image agent in all the cases of using an aqueous solution of palladium chloride.
(Adhesion Test)

The samples wherein deposition of nickel plating were found in Example 3 (evaluation; ◯) were brought into an electroless copper plating process under the same conditions as in Example 1 to obtain polyimide resin substrates having a metal film (or an electroless copper plating film) pattern. Two sheets of the polyimide resin substrates having a metal film pattern thus obtained were provided and were joined with solder by superimposing the surfaces of the metal film on each other.

Evaluation of adhesion was carried out by fixing one of the two sheets thus joined and peeling off the other.
X; The metal film was peeled off from the polyimide resin substrate.
◯: The metal film was not peeled off from the polyimide resin substrate.

Figure 4:
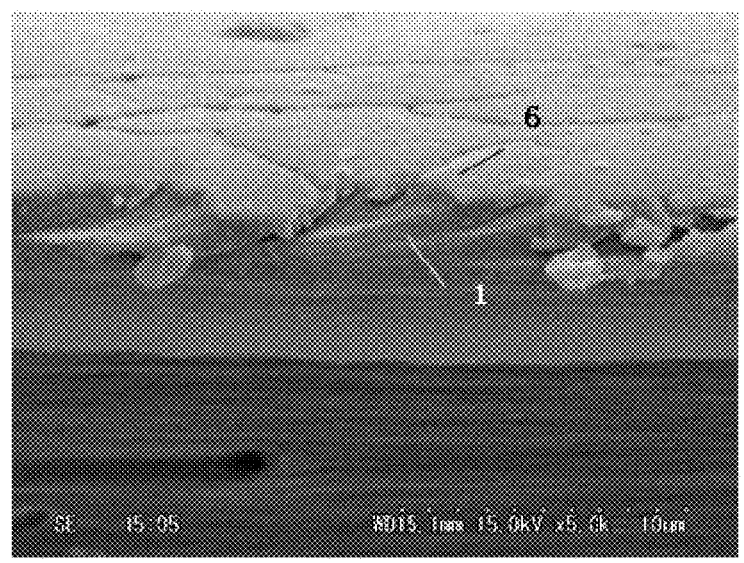
FIG. 4 shows an electron microscope photograph of a fracture surface of the polyimide resin substrate obtained by Example 3.

The result of evaluation was shown in Table 2. The metal film pattern was not peeled off and the polyimide resin substrate was found to be broken in each case. Detailed observation of the surface of broken section was made by an electron microscope (SEM). As a result, as shown in FIG. 4, it was clear that the polyimide resin substrate and the metal film were not peeled off with each other. In FIG. 4, "1" represents a polyimide resin substrate and "6" represents a metal film or an electroless copper plating film.

From the above-mentioned result, it was confirmed that the polyimide substrate obtained by the method of the present invention was excellent in adhesion between the polyimide resin substrate and the metal film.

Example 4

In this example, the treating time or holding time of latent image agent on the polyimide resin substrate was changed to 15 seconds, 60 seconds, 300 seconds and 600 seconds respectively. Experiments were carried out by adjusting other conditions same as in Example 1 until the step of electroless nickel plating. Deposition of electroless nickel plating and the line width of printed pattern were evaluated. A comparative experiment without treatment or with the treating time of 0 second was also carried out and was evaluated at the same time.

As a result, selective deposition of plating was found in the modified area imprinted with a latent image agent in all the cases of employing the treating time of 15 seconds or longer. In addition, the line width of printed pattern was not influenced by the difference of treating time (see Table 3).

Example 5

A polyimide resin substrate for printing of a latent image agent was prepared by cutting a polyimide resin film having a film thickness of 25 µm, brand name "Kapton H" manufactured by DU PONT-TORAY CO., LTD., to a proper size.

Using a latent image agent having viscosity of 26 to 389 Pa·s measured by a cone-plate viscometer at 25° C. with a rotor rotation number of 0.5 rpm, pattern-printing of a latent image agent onto the surface of said polyimide resin substrate was carried out by a gravure printer.

The latent image agent used here was prepared by adding carboxymethyl cellulose and a thixotropic agent for regulating viscosity appropriately to a solution comprising potassium hydroxide (KOH) as an alkaline compound with the alkali concentration of 3M.

Gravure printing was carried out by using a gravure printing plate (an intaglio plate) having the same linear-shape engraved groove as one used in Example 1. This engraved groove of the gravure printing plate has a line width of 21 µm and a depth of 5 µm.

As a result, correlative relationship between viscosity of a latent image agent and a line width of printed pattern was confirmed. It was found that, when viscosity of a latent image agent was low, the line width of printed pattern tended to be thick (see Table 4).

Examples 6 and 7

In these examples, a 0.1M citrate buffer solution of pH 5.8 containing 20 mM of dimethylamine borane and a 0.2M acetate buffer solution of pH 4.8 containing 20 mM of dimethylamine borane were used respectively as an acidic treatment liquid containing a reducing agent. The reduction treatment temperatures were 25° C., 35° C. and 50° C. respectively and treatment time (holding time) was 270 seconds. Experiments were carried out by adjusting other conditions same as in Example 1.

The content of palladium on the polyimide resin substrate was determined by fluorescent X-ray analysis before and after contacting with the acidic treatment liquid containing a reducing agent at a certain period of time, and the content of residual palladium after the reduction process was calculated as a metal holding ratio on the condition that the content of palladium before the reduction process was 100% (see Table 5).

By using the acidic treatment liquid containing a reducing agent, 90% or more of palladium could be held compared with that before the reduction treatment, which means that the falling of palladium during the reduction process was suppressed to a large degree.

Comparative Examples 1 and 2

In these comparative examples, a 0.2M phosphate buffer solution of pH 7.0 containing 20 mM of dimethylamine borane and a 20 mM sodium boron hydride of pH 12.5 were used respectively as an acidic treatment liquid containing a reducing agent. Experiments were carried out by adjusting other conditions same as in Example 6.

In the case of carrying out the reducing process under the condition other than acidic condition, the metal holding ratio was 60% or less and it was found that a significant falling of palladium from the polyimide resin substrate occurred (see Table 5).

TABLE 1

| Electroless Nickel Plating Bath and Electroless Copper Plating Bath | | |
|---|---|---|
| Electroless Nickel Plating Bath | nickel sulfate hexahydrate | 0.13M |
| | sodium hypophosphite monohydrate | 0.18M |
| | sodium acetate | 0.035M |
| | sodium citrate | 0.12M |
| | pH regulator aqueous ammonia | proper quantity |
| Electroless Copper Plating Bath | copper sulfate | 0.03M |
| | formaldehyde | 0.33M |
| | EDTA | 0.08M |
| | PEG-1000 | 250 mg/L |
| | 2,2'-bipyridyl | 10 mg/L |
| | pH regulator sodium hydroxide | proper quantity |

TABLE 2

| Palladium Ion Concentration and Deposition of Plating | | | | | |
|---|---|---|---|---|---|
| Pd Ion Concentration [mM] | 0 | 0.0085 | 0.085 | 0.43 | 0.85 |
| Selective Deposition of Plating | X | ◯ | ◯ | ◯ | ◯ |
| Adhesiveness | — | ◯ | ◯ | ◯ | ◯ |

TABLE 3

| Treatment Time of Latent Image Agent onto Polyimide Resin Substrate, Deposition of Plating and Printing Performance | | | | | |
|---|---|---|---|---|---|
| | Treatment Time of Latent Image Agent [sec] | | | | |
| | 0 | 15 | 60 | 300 | 600 |
| Selective Deposition of Plating | X | ◯ | ◯ | ◯ | ◯ |
| Line Width of Pattern [µm] | No Deposition | 42 | 42 | 42 | 42 |

TABLE 4

| Viscosity of Latent Image Agent and Line width of Printed Pattern | |
|---|---|
| Viscosity of Latent Image Agent [Pa · s] (25° C., 0.5 rpm) | Line width of Printed Pattern [µm] |
| 26 | 50 |
| 99 | 46 |
| 196 | 39 |
| 389 | 30 |

TABLE 5

| Difference of Reduction Condition and Metal Holding Ratio after Reduction Process | | | | | |
|---|---|---|---|---|---|
| | Acidic Treatment Liquid Containing Reducing Agent | pH | Reduction Temperature and Metal Holding Ratio | | |
| | | | 25° C. | 35° C. | 50° C. |
| Ex. 6 | 20 mM dimethylamine borane (Acetate Buffer Solution) | 4.8 | 93% | 98% | 97% |
| Ex. 7 | 20 mM dimethylamine borane (Citrate Buffer Solution) | 5.8 | 94% | 93% | — |

TABLE 5-continued

Difference of Reduction Condition and Metal Holding Ratio after Reduction Process

| | Acidic Treatment Liquid Containing Reducing Agent | pH | Reduction Temperature and Metal Holding Ratio | | |
|---|---|---|---|---|---|
| | | | 25° C. | 35° C. | 50° C. |
| Comp. Ex. 1 | 20 mM dimethylamine borane (Phosphate Buffer Solution) | 7.0 | — | 53% | 56% |
| Comp. Ex. 2 | 20 mM Sodium Boron Hydride | 12.5 | <50% | <50% | <50% |

INDUSTRIAL APPLICABILITY

According to the method of the present invention, a resin substrate having a metal film pattern excellent in reliable adhesiveness can be produced without using adhesives and/or employing an etching process. Therefore, the present invention enables to overcome a problem of deterioration of reliable adhesiveness of a metal film caused by corrosion with adhesives and/or etching liquid.

In addition, since an acidic treatment liquid containing a reducing agent is used in the reduction process of a metal salt in the present invention, falling off of metal ions scarcely occurs. Therefore, processes can be carried out by using a solution containing a low concentration of metal ions compared with the conventional methods, which is excellent in terms of practical utility.

Furthermore, by regulating the viscosity of a latent image agent and/or by employing a gravure printing technology, it would be possible to form a fine pattern having excellent accuracy.

The invention claimed is:

1. A method for producing a resin substrate having a metal film pattern formed thereon comprising the following steps in the order of (a) to (e):
   (a) pattern-printing a latent image agent onto a surface of a resin substrate, wherein the latent image agent is an alkali solution comprising at least one metal hydroxide selected from the group consisting of potassium hydroxide and sodium hydroxide,
   (b) contacting the surface of the resin substrate imprinted with the latent image agent with a solution comprising metal ions to form a metal salt on the surface of the resin substrate,
   (c) contacting the metal salt with an acidic treatment liquid comprising a reducing agent to reduce the metal salt on the surface of the resin film imprinted with the latent image agent,
   (d) forming an electroless nickel plating film on the surface of the resin substrate imprinted with the latent image agent, and
   (e) depositing an electroless copper plating onto a surface of the nickel plating film.

2. The method for producing a resin substrate according to claim 1, wherein the solution comprising metal ions has a metal ion concentration of from 0.01 mM to 0.9 mM.

3. The method for producing a resin substrate according to claim 1, wherein the metal ions are palladium ions.

4. The method for producing a resin substrate according to claim 1, wherein the acidic treatment liquid has a pH of 6 or lower.

5. The method for producing a resin substrate according to claim 1, wherein the latent image agent has a viscosity, measured by a cone-plate viscometer at 25° C. with a rotor rotation number of 0.5 rpm, in the range from 50 to 500 Pa·s.

6. The method for producing a resin substrate according to claim 1, wherein the pattern-printing of the latent image agent onto the surface of the resin substrate is carried out by using a gravure printing technology.

7. The method for producing a resin substrate according to claim 6, wherein the gravure printing technology comprises a gravure printing plate having an engraved groove having a depth of 1 to 10 μm and a line width of 10 to 50 μm.

* * * * *